United States Patent
Jandhyala et al.

(10) Patent No.: US 7,644,381 B2
(45) Date of Patent: Jan. 5, 2010

(54) ELECTROMAGNETIC COUPLED BASIS FUNCTIONS FOR AN ELECTRONIC CIRCUIT

(75) Inventors: Vikram Jandhyala, Seattle, WA (US); Swagato Chakraborty, Seattle, WA (US); James Pingenot, Seattle, WA (US)

(73) Assignee: University of Washington, Seattle, WA (US)

( * ) Notice: Subject to any disclaimer, the term of this patent is extended or adjusted under 35 U.S.C. 154(b) by 345 days.

(21) Appl. No.: 11/736,378

(22) Filed: Apr. 17, 2007

(65) Prior Publication Data
US 2007/0245275 A1    Oct. 18, 2007

Related U.S. Application Data

(60) Provisional application No. 60/745,027, filed on Apr. 18, 2006, provisional application No. 60/807,462, filed on Jul. 14, 2006.

(51) Int. Cl.
*G06F 17/50* (2006.01)
(52) U.S. Cl. ............................................. 716/5; 716/4
(58) Field of Classification Search .................. 716/4–5
See application file for complete search history.

(56) References Cited

U.S. PATENT DOCUMENTS

| | | | | |
|---|---|---|---|---|
| 7,149,666 B2* | 12/2006 | Tsang et al. | ................... | 703/2 |
| 7,356,791 B2* | 4/2008 | Rautio | ........................... | 716/5 |
| 2004/0225483 A1 | 10/2004 | Okoniewski et al. | ........... | 703/2 |

OTHER PUBLICATIONS

Ling et al., "Large-scale broadband parasitic extraction for fast layout verification of 3D RF and mixed-signal on-chip structures," IEEE MTT-S Int. Microwave Symp. Dig. Fort Worth, TX, pp. 1399-1402, Jun. 2004.*
Van Hese, Jan. "Accurate Modeling of Spiral Inductors on Silicon for Wireless RFIC Designs" *TechOnline* Nov. 20, 2001.

* cited by examiner

*Primary Examiner*—Jack Chiang
*Assistant Examiner*—Brandon W Bowers
(74) *Attorney, Agent, or Firm*—Ronald M. Anderson (57) ABSTRACT

A method and system to efficiently create electromagnetic coupled basis functions for an electronic circuit that is defined by geometry data and topology data. The geometry data for the circuit are read, and a three-dimensional mesh of polygons for the circuit is created. External port geometry and internal port geometry (internal ports occur where vias are attached to conductive layers) are determined from the geometry data. Circuit electromagnetic basis functions are then created as are loop-tree formations that are coupled to the basis functions. The loops include local loops, via loops, and hole loops. The three-dimensional mesh is efficiently created by extruding a two-dimensional mesh for each layer and via in the circuit.

31 Claims, 11 Drawing Sheets

FREQUENCY DOMAIN, SURFACE BASED METHOD OF MOMENTS

$\mathbf{E}^s_{\tan}(\mathbf{J}) + \mathbf{E}^i_{\tan} = Z_s \mathbf{J}$     ELECTRIC FIELD INTEGRAL EQUATION $\mathbf{E}^s(\mathbf{J}) = j\omega \mathbf{A} - \nabla \Phi$     SCATTERED ELECTRIC FIELD

$\mathbf{A}(\mathbf{r}) = \dfrac{\mu}{4\pi} \displaystyle\int_s \dfrac{e^{-jk|r-r'|}\mathbf{J}(\mathbf{r}')}{|\mathbf{r}-\mathbf{r}'|} ds'$     ELECTRIC VECTOR POTENTIAL $\Phi(\mathbf{r}) = \dfrac{1}{4\pi\varepsilon} \displaystyle\int_s \dfrac{e^{-jk|r-r'|}\rho(\mathbf{r}')}{|\mathbf{r}-\mathbf{r}'|} ds'$     ELECTRIC SCALAR POTENTIAL

$\nabla_s \cdot \mathbf{J}(\mathbf{r}) + j\omega\rho(\mathbf{r}) = 0$     CONTINUITY EQUATION

FIG. 5
300

LUMPED CIRCUIT BASIS FUNCTION

ELECTROMAGNETIC COUPLED BASIS FUNCTIONS FOR AN ELECTRONIC CIRCUIT

GOVERNMENT RIGHTS

This invention was made with U.S. Government support under grant No. N66001-01-8920 and W31P4Q-06-C-0097 awarded by the Defense Advanced Research Projects Agency (DARPA), and grant No. ECS0093102AM05 awarded by the National Science Foundation (NSF). The U.S. Government has certain rights in the invention.

RELATED APPLICATIONS

This application is based on prior copending provisional applications, Ser. No. 60/745,027, filed on Apr. 18, 2006, and Ser. No. 60/807,462, filed on Jul. 14, 2006, the benefit of the filing dates of which is hereby claimed under 35 U.S.C. §119(e).

BACKGROUND

One of the more processing intensive problems related to electronic circuit design is that of determining the electromagnetic coupling of a circuit. This function is typically carried out by doing an iterative evaluation of the circuit basis functions. The electromagnetic coupling for a multiple layer integrated circuit (IC) depends upon both the topology and geometry of the circuit. The topology is generally defined by data indicating the layout of electronic components on one or more layers of an insulating substrate, for example, by a schematic diagram that shows how the components are electrically interconnected, but not their physical disposition. By comparison, the geometry of a circuit specifies the physical layout of the circuit and is often indicated by a plurality of data files, such as Graphic Data System II (GDSII) and CalTech Intermediate Format (CIF) files. GDSII files are in a binary format that hierarchically represents planar geometric shapes, text labels, and other information about the layout of integrated circuits (ICs), while CIF files include machine/human readable textual hierarchical commands that define layers and describe the geometry of rectangles, traces, and pads found on IC masks used to create the circuit.

Boundary element method (BEM)-based field solvers are becoming popular for analyzing distributed field behavior in microelectronic circuits. To simulate large-scale microelectronic structures using BEM, a fast iterative solution is extremely useful to overcome time and memory bottlenecks posed by the dense matrices involved in a BEM formulation. However, convergence is a problem with an iterative solution of real-life microelectronic structures having very closely-spaced thin metal layers, due to the poor spectral properties of the system matrix. Therefore, a good linear complexity pre-conditioner is mandatory to improve the spectral properties of the BEM system matrix and to obtain a solution in a reasonable number of iterations using, for example, a Krylov subspace-based iterative solver.

The reasons for poor spectral properties of the BEM matrix are mainly attributed to: (a) decomposition of the divergence-free and divergent components of the currents at lower frequencies; (b) the use of long, thin triangles in the mesh over the geometric description; and, (c) the use of closely-spaced basis functions in the geometry of the BEM matrix. It would be desirable to separately address these two issues in the design and implementation of a three-stage pre-conditioner. For example, item (a) might be addressed by initially carrying out two stages, namely a "Loop-Tree Decomposition" and a "Basis Function Rearrangement." Problem (c) might be resolved by a third stage, using "Thresholded Incomplete LU Decomposition" (where "LU" refers to the product of a lower triangular matrix and an upper triangular matrix).

For small electrical circuits, the magnetic vector potential (due to solenoidal current) and electric scalar potential contributions (due to divergent current) in electric field integral equation (EFIE) becomes decoupled. Linear Rao-Wilton-Glisson (RWG) basis functions that are traditionally used for modeling EFIE inherently couple the divergence-free and divergent components of current, so at low frequency, the EFIE matrix suffers from the classically known ill-conditioning problem that gives rise to poor convergence properties when an iterative solution is used. The conventional way to solve this problem is by constructing a set of divergence-free (loop) and divergent (loop free—tree) basis functions to model the current. A more effective approach would be to construct loop-tree basis functions for geometries with arbitrary numbers of holes and handles. However, for closely packed, thin three-dimensional (3-D) structures and for non-uniform discretization, even with loop-tree decomposition, the convergence of iterative solver may be poor. An incomplete-LU based pre-conditioner, if used in connection with loop-tree decomposition, should further improve the convergence behavior.

In addition, it would be helpful to employ an efficient technique for creating a 3-D mesh layout for a circuit from a two-dimensional (2-D) layout of the circuit. Such a method for efficiently creating a 3-D mesh layout without the complexity normally encountered should improve the efficiency of the overall solution of the EM coupling problem.

SUMMARY

Accordingly, one aspect of the approach described herein is directed to an exemplary method for determining electromagnetic coupling for a multiple layer electronic circuit in an automated manner. The method includes the step of reading geometry data defining a geometry of the electronic circuit, wherein the geometry data represent a physical layout of the electronic circuit. In addition, topology data defining a topology of the electronic circuit are read or input, wherein the topology data include a schematic representation of the electronic circuit. The geometry data are then used to determine an internal port geometry and an external port geometry for the electronic circuit. The method then provides for creating electromagnetic coupling basis functions for the electronic circuit using the topology data and the internal port and external port geometry. The electromagnetic coupling basis functions define the electromagnetic coupling for the electronic circuit. Finally, the electromagnetic coupling basis functions are presented to a user. As used herein, the term "presented" is intended to encompass many different ways of making available or usable. For example, the electromagnetic coupling basis functions can be input to another application for use in carrying out further steps, or can be displayed on a display screen or produced as a print out. However, these examples of the meaning of the term "presented" as used in this context, are not intended to be in any way limiting.

The step of reading the geometry data can comprise the step of creating a three-dimensional mesh representing the physical layout of the electronic circuit, including any conductive layers, vias interconnecting connective layers, and holes formed in the conductive layers. Accordingly, in this exemplary method, the geometry data comprise a two-dimensional layout file. In one embodiment, the step of creating the three-dimensional mesh comprises the steps of reading the two-dimensional layout file and performing preprocessing. The preprocessing can merge discrete polygons included in the two-dimensional layout file and identify any holes in the layout defined by the two-dimensional layout file. Next, after the step of preprocessing, a two-dimensional mesh of polygons is created for each layer included in the two-dimensional layout. Each layer and via included in the two-dimensional mesh is then extruded to form the three-dimensional mesh. The vias are linked to attached layers with circuit connections (also sometimes referred to herein as "circuit shorts"), so that the vias comprise a portion of the three-dimensional mesh.

When processing the geometry data to determine each external port in the circuit, each connection between two distinct nets is identified. Each discrete net comprises an independent metal geometry that may be electrically coupled with another discrete net by one or more components of the circuit.

Also, the step of processing the geometry data to determine each internal port in the circuit can include the step of determining where a surface or a subsurface of the geometry data is associated with one or more circuit nodes.

To create the electromagnetic coupling basis functions, the three-dimensional mesh can be used to automatically detect all loop-tree formations. The loops comprise a set of divergence-free basis functions and include all local loops, via loops, and hole loops within the geometry data; all loops that are thus detected are linearly independent. The tree formations comprise a set of divergent basis functions that are loop-free. When using the three-dimensional mesh to detect local loops, a vertex defining a node in three-dimensional mesh is selected, all basis functions flowing through edges that are connected to the node are collected, and partial loops that pass through an outer edge of the three-dimensional mesh are eliminated.

The step of detecting loops comprises the step of detecting each of two types of via loops, including one type in which a via loop is formed between two vias joined to the same conductive layers in the geometry data, and another type in which a via loop is formed between two circuit connections running from a via to the same conductive layer. For each different pair of vias that are joined to the same conductive layers, the step of detecting the one type of via loop that is formed between the two vias joined to the same conductive layers includes the following steps. Each of the two vias of the pair are identified, and a shortest path within the conductive layers between the two vias and between the conductive layers is found. Also, in each conductive layer, excluding the vias, a shortest path through each of the two vias is found. Finally, the shortest paths between the two vias and through each of the two vias are combined, so as to form the one type of via loop.

The step of detecting the other type of via loop that is formed between two circuit connections running from a via to the same conductive layer includes the following steps. First, a via is identified, and all circuit connections running from the via to the same conductive layer are found and enlisted. End points of each circuit connection in the conductive layer are then identified. Similarly, end points of each circuit connection in the via are identified. The end points for each different pair of circuit connections are then joined to form via loops, wherein each different via loop thereby includes the end points for a different pair of circuit connections.

In addition, the step of detecting loops comprises the step of detecting each of two types of hole loops, including one type in which a hole loop is formed around a hole in a given conductive layer, and another type in which a hole loop is formed between two holes in a given three-dimensional conductive layer having a first surface, and a second surface that is generally on an opposite side of the conductive layer than the first surface. The step of detecting the one type of hole loop that is formed around a hole in a given conductive layer includes the following steps. First, it is necessary to ensure that the hole is formed in a conductive layer and not in a via. Next, the conductive layer is thinned to extract the first surface of the conductive layer (unless the conductive layer is already represented in a 2-D form). Finally, the boundary edges of the conductive layer around the hole are joined to form the hole loop in the first surface.

To automatically detect tree formations, a spanning tree algorithm can be executed over a connected graph formed by elements of the three-dimensional mesh and the connectivity of the elements through edges of the three-dimensional mesh and circuit connections. The method can then include the step of rearranging the tree formation basis functions to map onto a charge for each polygon in the three-dimensional mesh. The step of rearranging the tree formation basis functions can include an iterative process. A convergence of the iterative process is improved by employing a pre-conditioner, such as an LU matrix factorization pre-conditioner.

Another aspect of this approach is directed to a memory medium (e.g., optical or magnetic media) on which computer readable and executable machine instructions are stored for carrying out functions that are generally consistent with the steps noted above.

Yet another exemplary aspect of this technology is directed to a system for determining electromagnetic coupling for a multiple layer electronic circuit in an automated manner. The system includes a memory in which geometry data defining a geometry of the electronic circuit, topology data defining a topology of the electronic circuit and including a schematic representation of the electronic circuit, and machine instructions are stored. A display is included for displaying data to a user. A processor is coupled to the memory and the display and executes the machine instructions to carry out a plurality of functions that are also generally consistent with the steps of the method discussed above.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein.

DESCRIPTION

Figures and Disclosed Embodiments are not Limiting

Exemplary embodiments are illustrated in referenced Figures of the drawings. It is intended that the embodiments and Figures disclosed herein are to be considered illustrative rather than restrictive. No limitation on the scope of the technology and of the claims that follow is to be imputed to the examples shown in the drawings and discussed herein.

Figure 5:
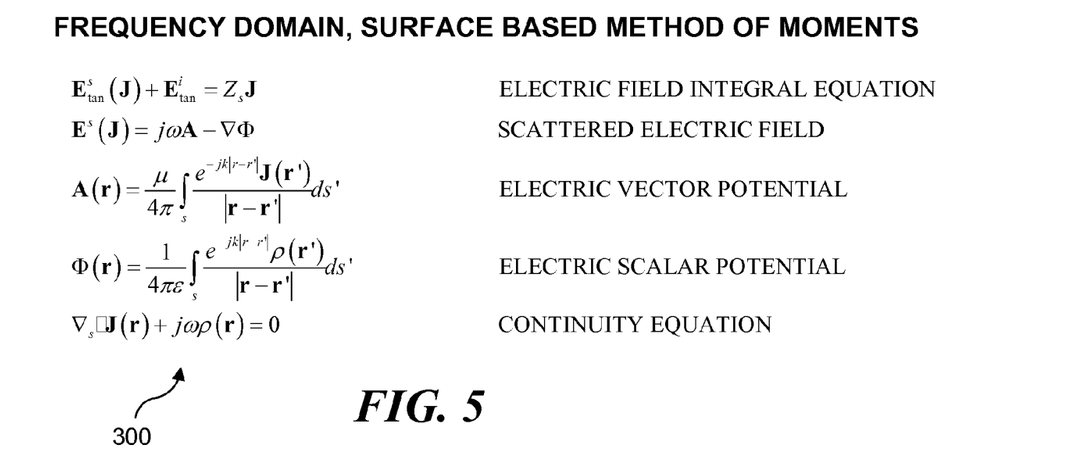
FIG. 5 is a list of equations used in a surface based method of moments for the frequency domain.

Overview of Technique for Determining Electromagnetic Coupling in a Multiple Layer Electronic Circuit An efficient technique has been developed for determining the electromagnetic coupling for an electronic circuit having multiple layers. In this approach, an electric field integral equation is implemented using Method of Moments to model electromagnetic field behavior in the circuit. FIG. 5 illustrates a number of equations that are used in a surface based method of moments 300. Electric current flowing through conducting circuit components is modeled using a one or more types of edge-based basis functions such as Rao-Wilson-Glisson, Rooftop, etc., and a novel lumped circuit basis function is then determined, as indicated by an exemplary lumped circuit basis function 302 in FIG. 6A. These basis functions are subsequently transformed into divergence-free loops and divergent tree/star/pulse basis functions and used to construct a method of moment system matrix. The basis functions are automatically created from a combined description of circuit and geometry that are provided in widely used standard formats, as described below.

Figure 1:
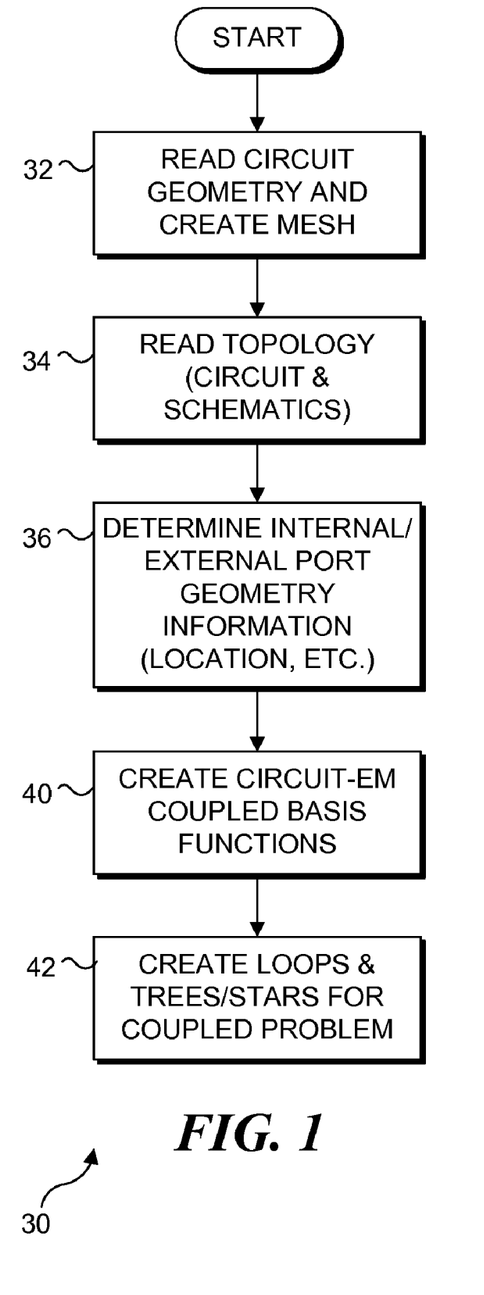
FIG. 1 is a high-level flowchart showing exemplary logical steps for determining circuit EM coupled basis functions.
Figure 6A:
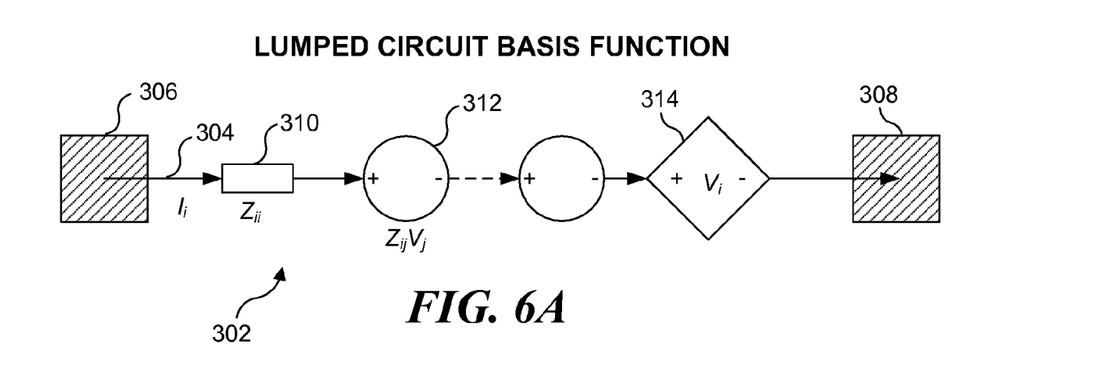
FIG. 6A is a schematic diagram illustrating a lumped circuit basis function.

The high level steps involved in obtaining the final basis functions to model current flowing on conductive surfaces of the circuit are illustrated in a flowchart 30, which is included in FIG. 1. A first step 32 of the technique involves reading a circuit geometry and determining a mesh for the geometry of the circuit. The geometry of a circuit is typically defined in layout files such as GDSII, and CIF files, which provide polygon descriptions of the circuit, and indicate the stackup and technology data for the circuit. A step 34 then provides for reading the topology of the circuit, i.e., the circuit and schematics that indicate the components of the circuit and their electrical interconnections. Next, in a step 36, a processor implementing this technique determines the port geometry information of the circuit, including information specifying the location of the internal and external ports and other relevant parameters. A step 40 creates circuit-based electromagnetic (EM) coupled lumped circuit basis functions (like an exemplary lumped circuit basis function 302, which is illustrated in FIG. 6A and discussed below). This step involves considerable detail, which is explained below. Then, a step 42 creates loops and trees/stars in connection with the basis functions for the coupled problem. It should be emphasized that this step will be understood to encompass creation of other representations of the loops-tree and loop-star basis functions, such as loop pulses, as will be well known to those of ordinary skill in the art. Details of several of these steps shown in FIG. 1 are discussed below.

The following discussion explains each of these steps and provides examples that facilitate a clear understanding of each of the steps carried out in this novel technique.

Method for Creating a 3-D Mesh from 2-D Layout Representations

A method has also been developed for creating a 3-D mesh from 2-D computer assisted drawing (CAD) layout representations. This method corresponds to a portion of the task carried out in step 32 of FIG. 1. A flowchart illustrating further details of one of the steps for one exemplary approach that can be employed to produce such a 3-D mesh is shown in FIG. 2.

As noted above, CAD files (such as GDSII or CIF) provide layout representations for fabrication masks. The layer information in these files includes layer thickness and separation. The method used here involves taking these 2-D representations and transforming them to a 3-D mesh for an electromagnetic simulation, generally as illustrated in the simple examples shown simplistically in FIG. 3, and in greater detail in FIGS. 4A, 4B, 4C, and 4D. To carry out this method, the mask layers are meshed using a 2-D meshing algorithm. These 2-D meshes are then extruded to 3-D. Via layers are flagged manually and connected to the 2-D mesh layers via circuit connections. The creation of these circuit connections that connect the polygons comprising the 3-D mesh formed on the ends of the vias, to the mesh in the metallic layers is novel and produces the internal ports that are referenced in step 36 of FIG. 1. The advantage to this method is that it involves a relatively easy 2-D mesh generation (the extrusion to form the 3-D being relatively easy compared to the conventional approach used to form a 3-D mesh).

Figure 2:
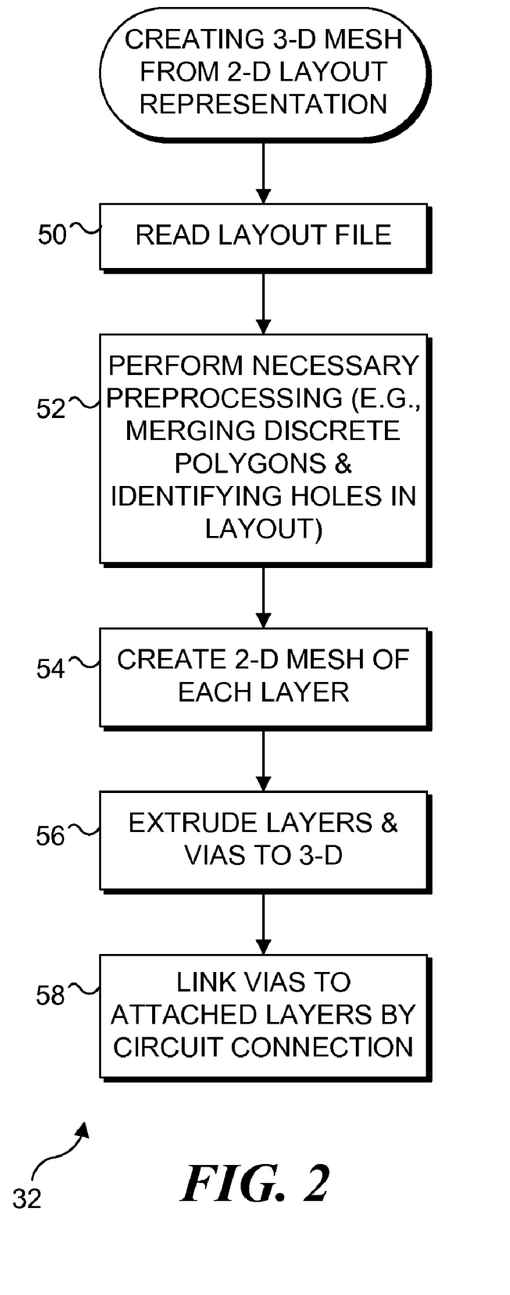
FIG. 2 is a flowchart showing exemplary details of the procedure that can be used to create a 3-D mesh from a 2-D layout that is based upon geometry data for a circuit.
Figure 3:
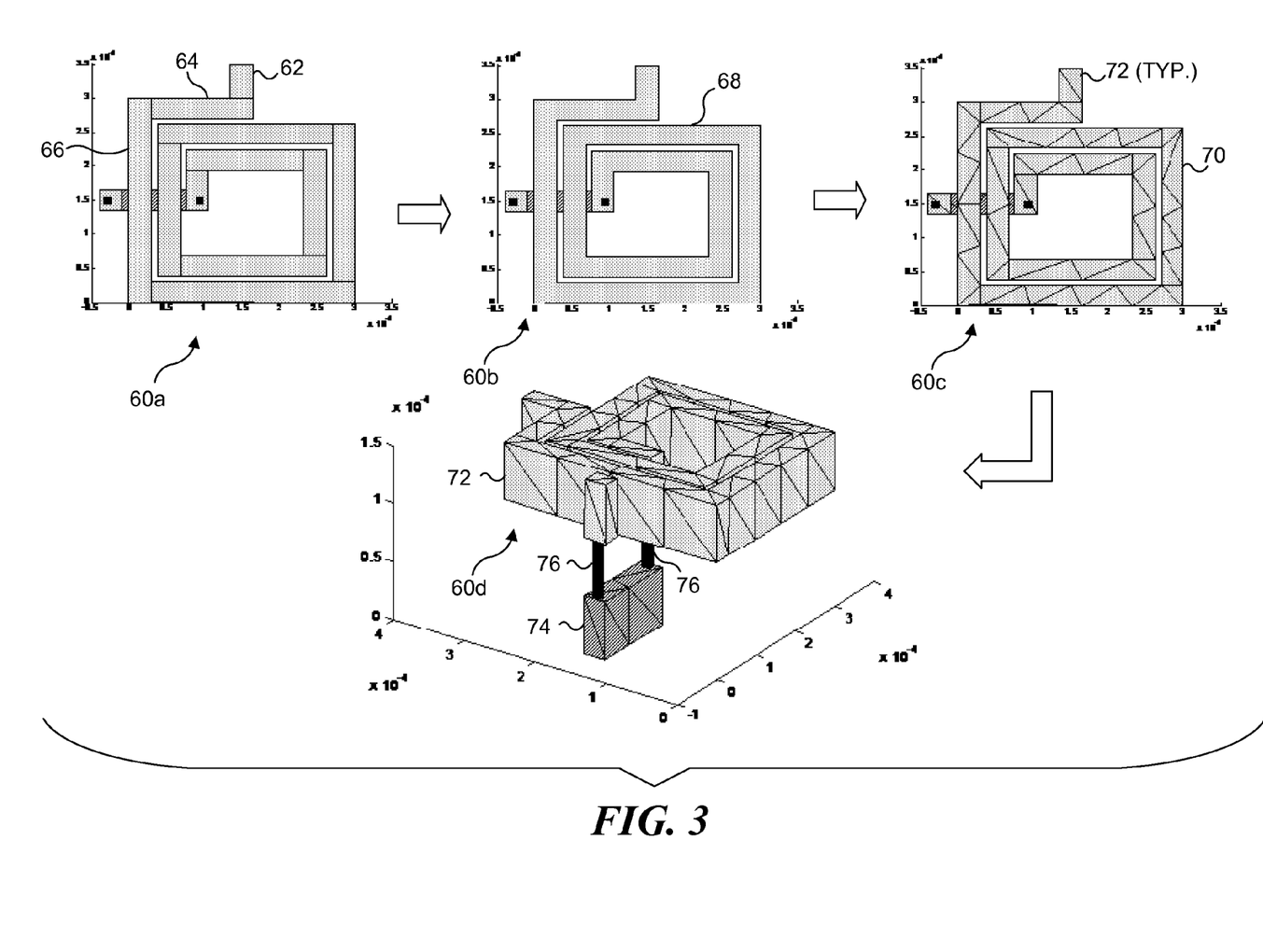
FIG. 3 illustrates successive views showing how a 3-D mesh is derived from a 2-D layout that is defined by geometry data for a simple exemplary circuit.

One embodiment of this approach follows the exemplary procedure illustrated in the steps of a flowchart 32 in FIG. 2. In a step 50, the method provides for reading the geometry layout file. An example shown on the left side of FIG. 3 illustrates a simple circuit layout 60a comprising a plurality of discrete polygons, including polygons 62, 64, and 66 (only some of the polygons are labeled with reference numbers). A step 52 then indicates that any necessary preprocessing is carried out. For example, it will typically be necessary to merge the discrete polygons, such as polygons 62, 64, and 66, and identify holes in the layout, as part of the preprocessing step. A result 60b of merging the polygons is shown in FIG. 3. A step 54 indicates that the method next provides for creating a 2-D mesh of each layer in the layout, and in an example 60c of FIG. 3, a 2-D mesh 70 is illustrated that includes a plurality of triangles 72, although the 2-D mesh can comprise other types of polygons, such as rectangles, parallelograms, etc. In a step 56, the mesh of the 2-D layers and vias thus created is extruded to create a 3-D mesh. The example of FIG. 3 illustrates a 3-D mesh 60d, that includes triangles 72 on one layer and triangles 74 on another layer. Finally, in a step 58, the vias are linked to attached layers by circuit connections.

Figure 6B:
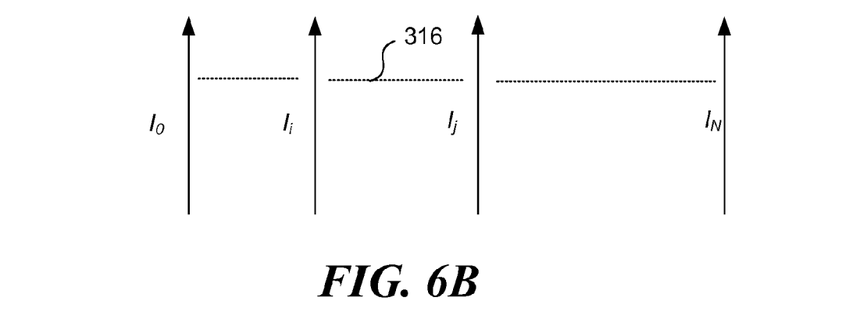
FIG. 6B is a diagram showing different current levels, including current in an alternative path, for the exemplary lumped circuit basis function of FIG. 6A.
Figure 6C:
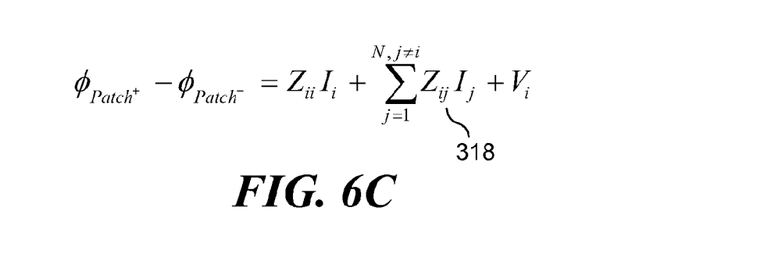
FIG. 6C is an equation that can be employed to determine a difference in voltage between two patches comprising the exemplary lumped circuit basis function of FIG. 6A.

External ports are used to model the user-defined global excitations to the simulation geometry. Internal ports are used to provide electrical connectivity between pieces of the meshed geometry that are electrically isolated by defining a finite-impedance path between these pieces. Internal ports can be automatically determined based on the geometrical information included in the geometry data for a circuit. For example a via element and a trace element can be connected by an internal port automatically based on their geometrical positions. Additionally, internal ports can be defined by the user to connect an N-port 13 parameter to the geometry for electromagnetic simulation. Both internal and external ports are implemented using the lumped circuit basis functions. An exemplary lumped circuit basis function 302 illustrated in FIG. 6A, is defined between two polygons 306 and 308 (i.e., patches on the metal surface, which are illustrated in this Figure by two rectangles) and provides a path for an electric current 304 to flow between the two polygons. The current flow is assigned with a reference direction by assigning polygon 306 as positive and polygon 308 as negative. The reference direction assumes electric current is flowing from the positive patch to the negative one. The path may include elements such as a self-impedance 310, a mutual impedance 312 and one (or more) constant voltage sources 314. A self-impedance 310 causes a voltage drop in the path proportional to the electric current flowing in the path. The mutual impedance causes an additional voltage drop in the path proportional to the electric current flowing in some other path 316, as shown in FIG. 6B, and they are implemented as current-controlled voltage sources. Also, independent voltage source 314 adds a constant voltage drop in the path. Finally, the total voltage drop across the path is set equal to the difference in potential on positive polygon 306 and negative polygon 308. Such a system can be mathematically described by equation 318, which is shown in FIG. 6C.

In 3-D mesh 60d of FIG. 3, circuit connections 76 link the two layers extruded from 2-D mesh 70. This coupling enables maintaining an accurate model for simulation, while greatly increasing the ease of mesh generation and is often done with a short circuit, although other circuit connections can be employed.

Figure 4A:
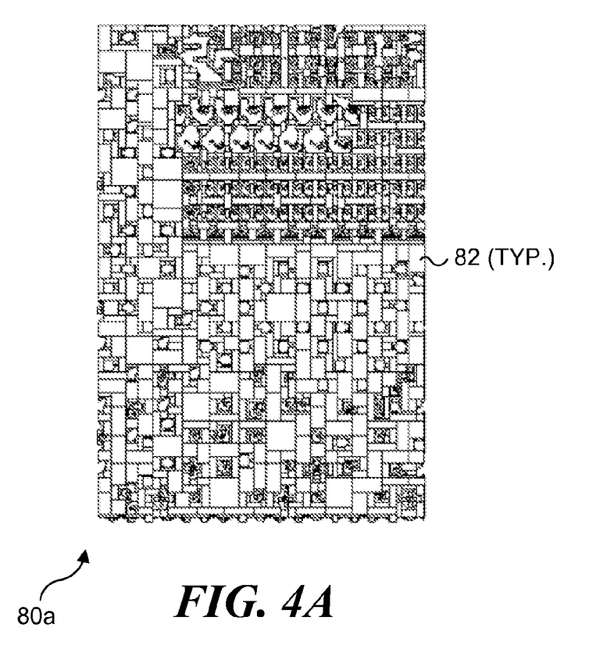
FIGS. 4A, 4B, 4C, and 4D illustrate successive views showing how a 3-D mesh is created for a plurality of layers and vias coupling the layers, for a more complex exemplary electronic circuit.
Figure 4B:
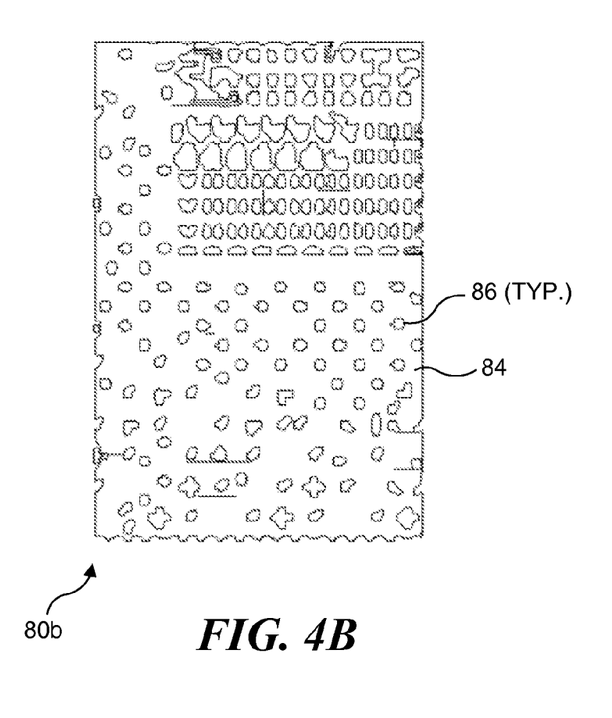
Figure 4C:
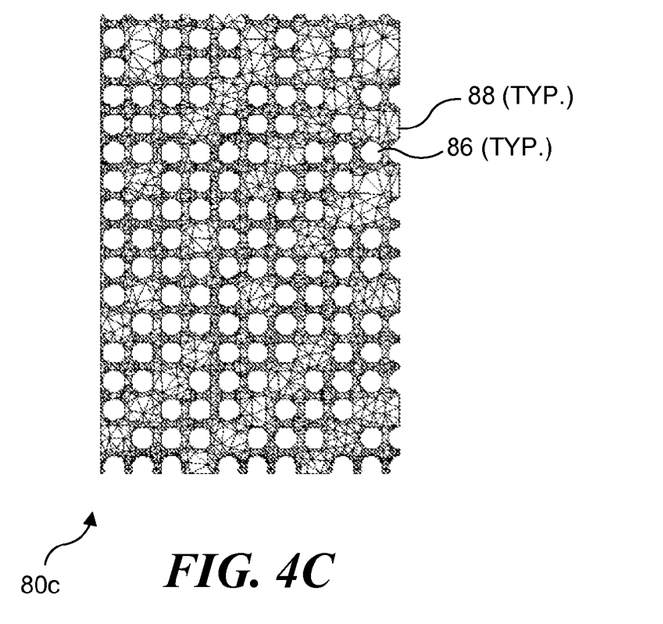
Figure 4D:
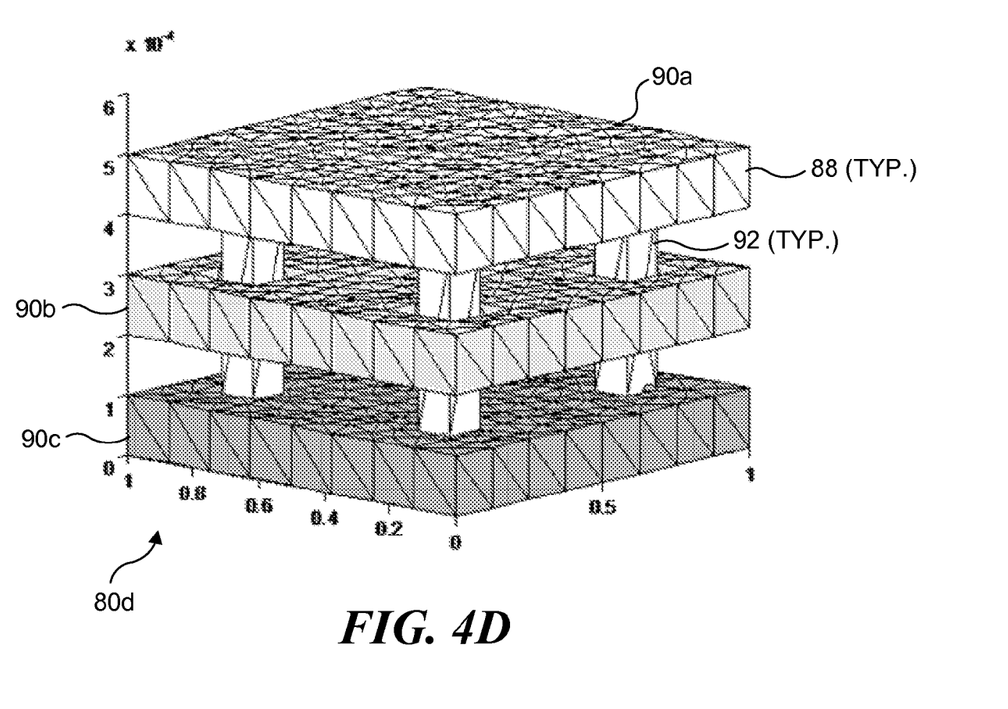

A more complex example showing how the 3-D mesh is created with this novel approach is illustrated in FIGS. 4A-4D. In FIG. 4A, a 2-D layout of an electronic circuit 80a is illustrated and comprises a plurality of discrete polygons (i.e., rectangles 82 in this example). The 2-D layout is defined by the geometry data for the electronic circuit. In a 2-D electronic circuit representation 80b shown in FIG. 4B, the discrete polygons in this 2-D layout are merged to form an integral conductive surface 84 with holes 86. Next, as shown in FIG. 4C, a 2-D mesh of triangles 88 (or other types of polygons, such as rectangles or quadrilaterals) has been formed in a generally conventional manner over integral conductive surface 84 (from FIG. 4B), to form a meshed representation 80c of the electronic circuit. Finally, as shown by a representation 80d in FIG. 4D, the 2-D mesh of triangles is extruded to form a 3-D mesh of triangles 88 (or of the other polygons that were used to create the 2-D mesh), including vias 92 that interconnect three layers 90a, 90b, and 90c of this exemplary electronic circuit (where a 2-D mesh was created for each layer and each via, and each 2-D mesh was then used to create the 3-D mesh for that layer/via). The extrusion process creates the 3-D mesh on the sides of each layer and on the sides of the vias.

Determining Loops

For electrically small problems the magnetic vector potential (due to solenoidal current) and electric scalar potential contributions (due to divergent current) in electric field integral equation (EFIE) becomes decoupled. The linear RWG basis functions that are traditionally used for modeling EFIE inherently couple the divergence-free and divergent components of current, so at low frequency, the EFIE matrix suffers from the classically known ill-conditioning problem that gives rise to poor convergence properties when an iterative solution is used. The conventional way to solve this problem is by constructing a set of divergence-free (loop) and divergent (loop-free—tree) basis functions to model the current. The following discussion addresses the construction of loops and tree basis functions for geometries with arbitrary numbers of holes and handles. Also, for closely packed thin 3-D structures and for non-uniform discretization, even with loop-tree decomposition, the convergence of iterative solver may be poor. An incomplete-LU based pre-conditioner can be used in connection with the loop-tree decomposition to further improve the convergence behavior.

Figure 8A:
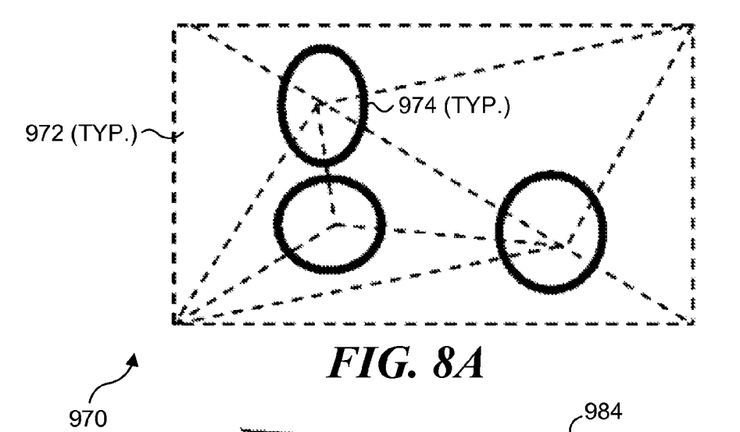
FIG. 8A is a schematic view of a portion of an exemplary 3-D mesh, illustrating local loops that are formed around vertices or nodes in the mesh.
Figure 8B:
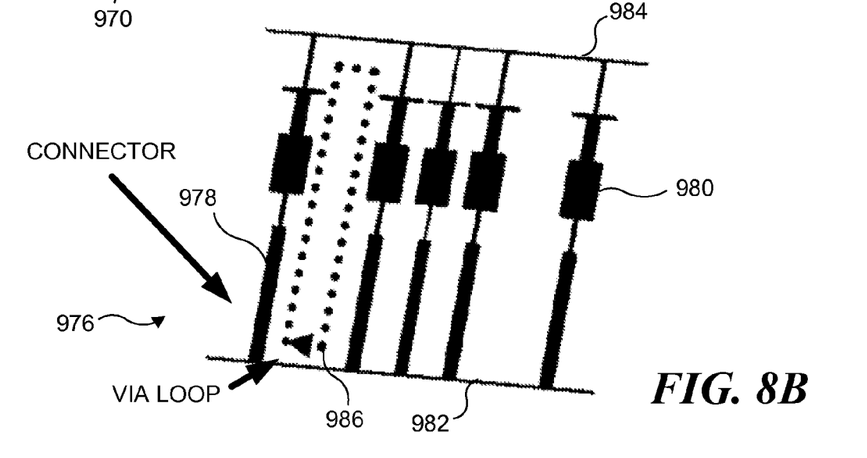
FIG. 8B is a schematic view of a via loop that is formed by adjacent vias connecting two conductive layers.
Figure 8C:
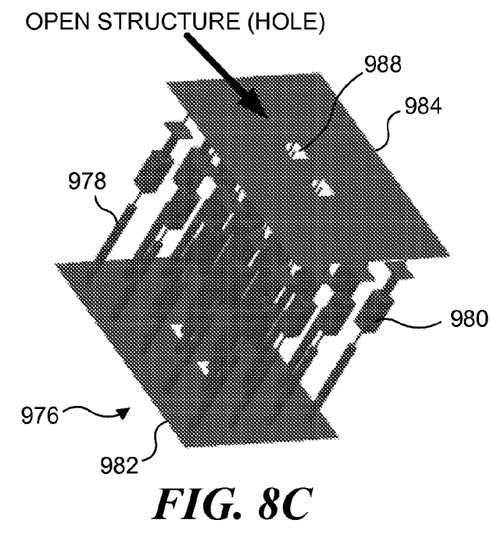
FIG. 8C illustrates open structures (or holes) that are formed in a metallic layer.
Figure 8D:
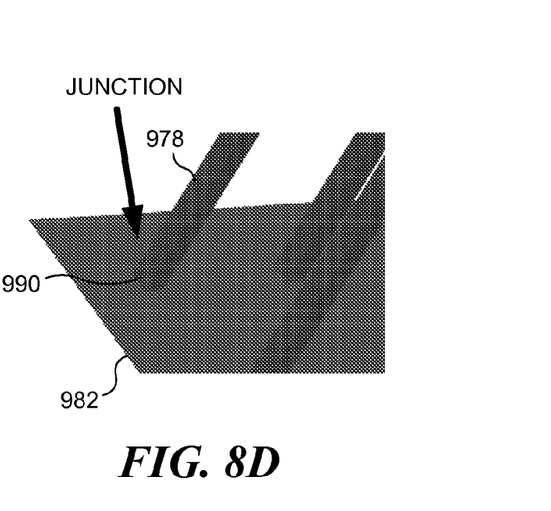
FIG. 8D illustrates details of a junction for a handle that contacts a metallic layer.

In general, there can be three types of loops in layered microelectronic circuits, including local loops, loops due to vias, and loops due to holes. FIG. 8A illustrates a simple example 970 of local loops 974 that occur around the common vertices of triangles 972 in a 3-D mesh; FIG. 8B illustrates a simple example 976 of a via loop 986 that is formed by adjacent vias 980 that connect metallic layers 982 and 984 through connectors 978; FIG. 8C illustrates open structures (or holes) 988 formed in metallic layer 984; and FIG. 8D illustrates details of a junction 990 for handle 978 contacting metallic layer 982. When detecting these three types of loops in a circuit, the following points have to be addressed:

All loops have to be detected

All detected loops have to be linearly independent

The smallest possible loops have to be detected

The loop detection algorithm should not be more complex than o(N).

Figure 9:
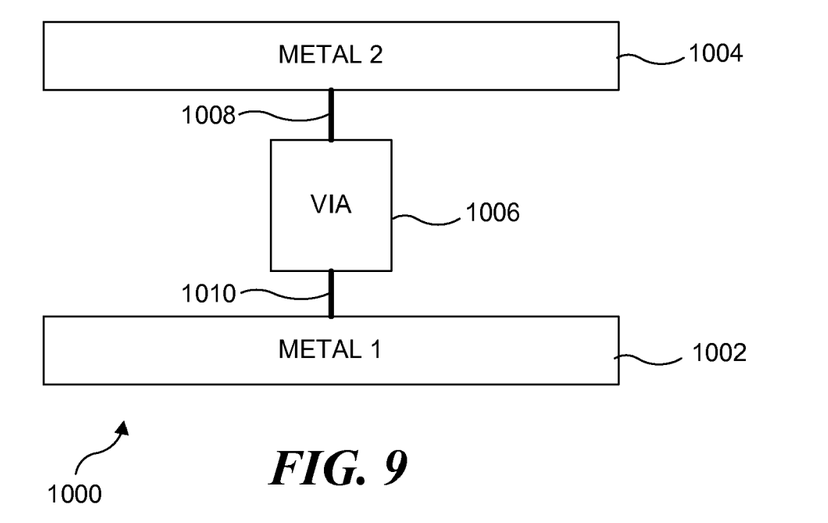
FIG. 9 illustrates one-dimensional lumped circuit connections that connect vias to metallic layers, thereby defining internal ports used in the present approach.

An exemplary algorithm has been developed for layered microelectronic structures that satisfies all of the above criteria. In this algorithm, the metal layers 1002 and 1004 in a circuit 1000 are connected to a via 1006 through very small one-dimensional (1-D) lumped circuit connections 1008 and 1010 as shown in FIG. 9. This arrangement helps in keeping individual layers singly connected and reduces additional complex loops in the structure. The details of the exemplary algorithm that are employed in step 42 for automatically detecting loops are indicated under a block 900a in FIG. 12A for each type of loop. A block 900b indicates the conventional approach for forming tree (or start) basis functions is carried out by running a spanning tree algorithm over the connected graph formed by mesh elements and their connectivity through RWG (or rooftop) edges and circuit connections. Details of this step 900b are not illustrated, because they are generally conventional and well known in the art.

1. Local Loop Detection

Figure 10:
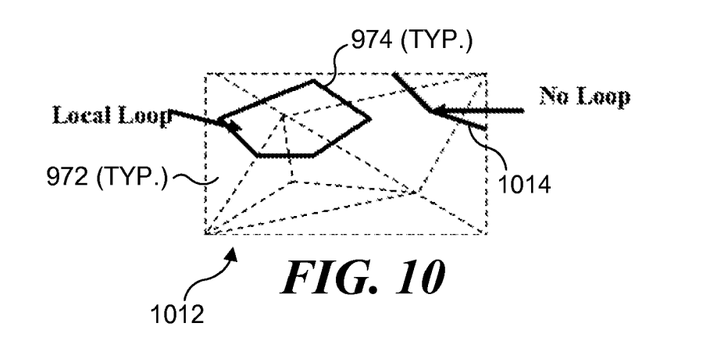
FIG. 10 illustrates a portion of a 3-D mesh, showing how a local loop is formed around an internal vertex or node, but not where the edge of the mesh terminates the sides of the local loop.

A block 902 in FIG. 12A introduces the steps employed for detecting local loop basis functions, as follows. The method provides for picking a vertex or node on the meshed geometry in a step 904. (FIG. 10 illustrates local loop 974 for a mesh layout 1012 that is formed around the node where the vertices of triangles 972 are joined.) Next, a step 906 collects all of the basis functions flowing through the edges connected to the node. A step 908 determines if such a local loop is formed around the node, and discards any portions 1014 (FIG. 10) of a loop that passes through the edges of the mesh layout. The above-described method of connecting metal layers through vertical vias, rules out the possibility of junctions.

2. Via Loop Detection

Figure 11A:
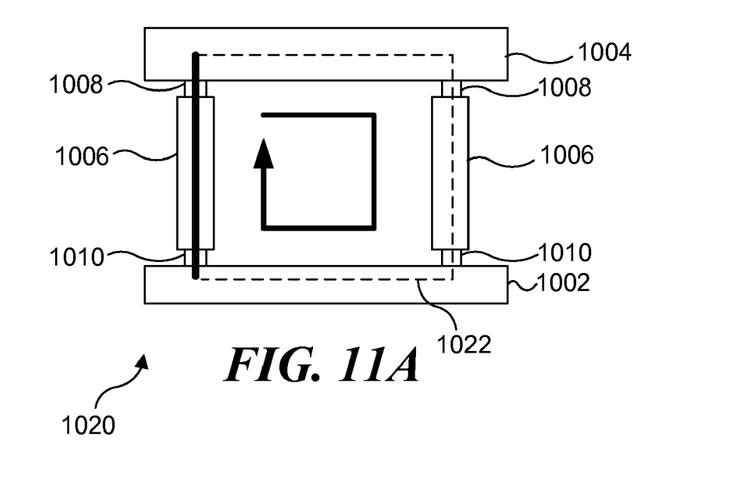
FIG. 11A illustrates a first case for a via loop, where the via loop is defined by adjacent vias that are connected to the same two conductive layers.

There are two cases involved in via loop detection. The logical steps for these cases are shown in FIG. 12A. The first case covers loops formed between two vias joining the same layers. This case is illustrated by a simple example 1020 in FIG. 11A in which metallic layers 1002 and 1004 are joined by vias 1006, where opposite ends of the vias are coupled to the layers by connectors 1008 and 1010, respectively. The logical steps for these cases are shown in FIG. 12A. The first case is indicated by a block 912. This case starts with the step of identifying a via, as indicated in a block 914. A step 916 then finds the shortest path through each layer, excluding the vias. Similarly, a step 918 finds the shortest path through each of the vias. These shortest paths are then combined in a step 920, to get each loop. A step 922 applies an algorithm to check the linear independence of the via loops that have thus been detected.

Figure 11B:
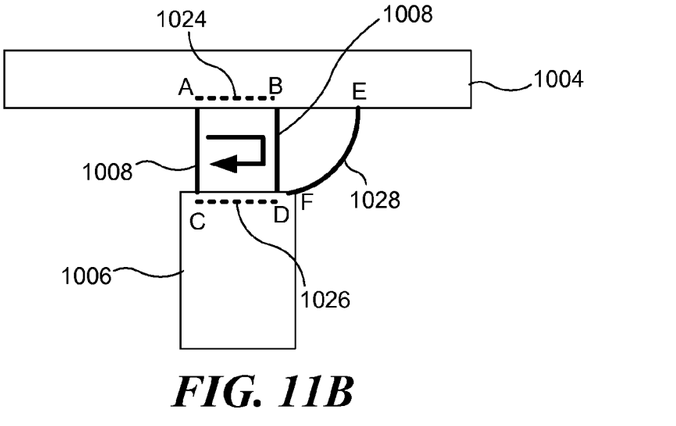
FIG. 11B illustrates a second case for a via loop, where the via loop is formed by pairs of conductive shorts running to the same metallic layer.
Figure 12A:
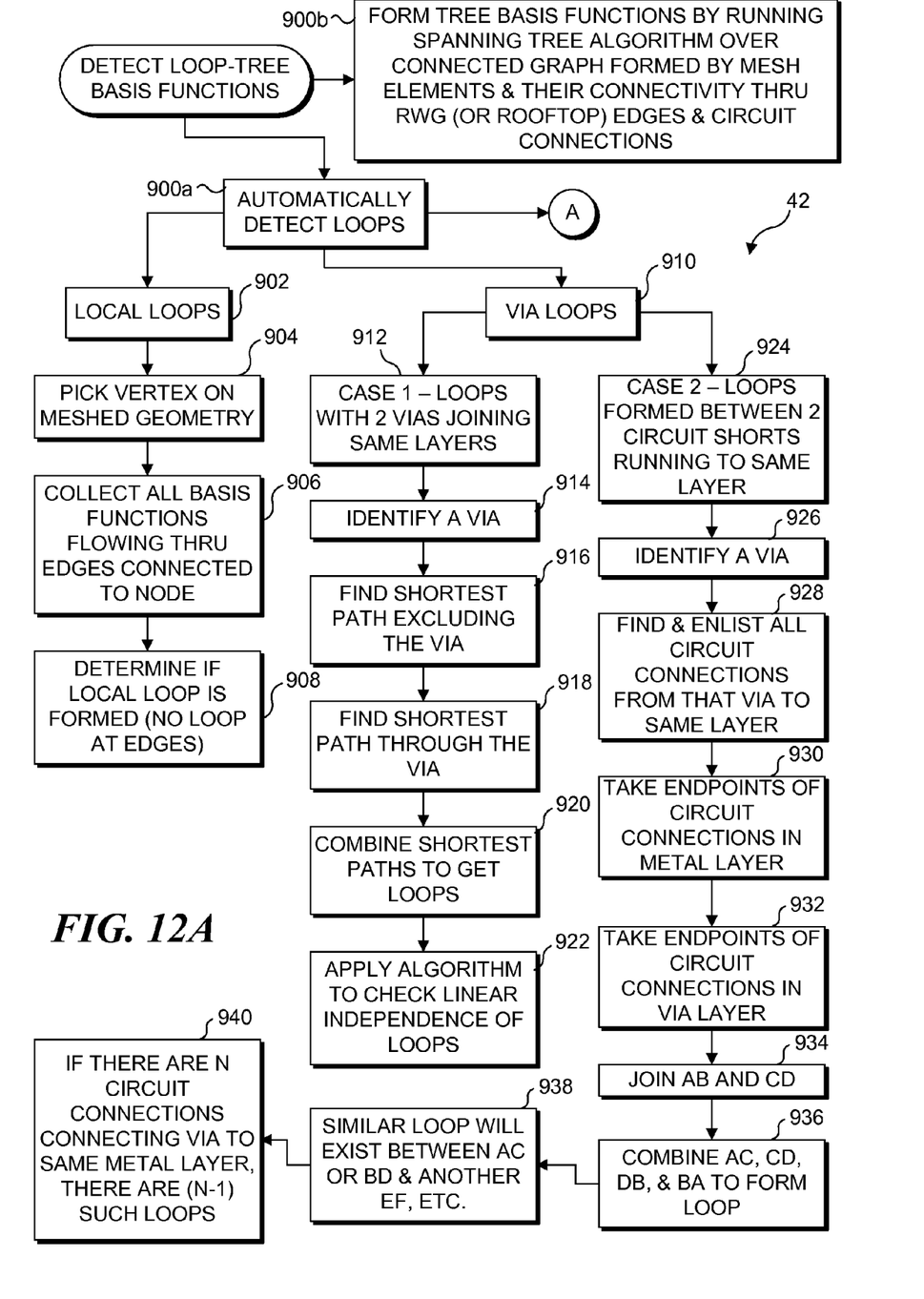
FIGS. 12A and 12B (together) define a flow chart showing exemplary logical steps for detecting loop-tree basis functions, including detecting local loops, via loops, and hole loops.

As indicated in a block 924 in FIG. 12A, the second case covers detecting each loop formed between two circuit shorts running to the same metallic layer. FIG. 1B illustrates the second case, where via 1006 is coupled by connections 1008 to metallic layer 1004; another connection 1028 also connects via 1006 to metallic layer 1004. The steps for the second case also start with a step 926, for identifying a via. A step 928 finds and enlists all circuit connections from the via that was identified to the same metallic layer. Next, a step 930 takes the endpoints of the circuit connections 1024 in the metallic layer, i.e., between A and B in FIG. 11B. Similarly, a step 932 takes the endpoints of a circuit connection 1026 in the via layer (i.e., between C and D in via 1006). In regard to the present example, a step 934 joins AB and CD. A step 936 then combines the connections indicated as AC, CD, DB, and BA to form a via loop. A block 938 indicates that a similar loop will exist (in the present example) between AC or BD and the other connection 1028 then extends between E in metallic layer 1004 and F in via 1006. More generally, a block 940 indicates that if there are N circuit connections connecting the via to the same metallic layer, then there will be (N-1) such via loops.

3. Hole Loop Detection

Figure 7A:
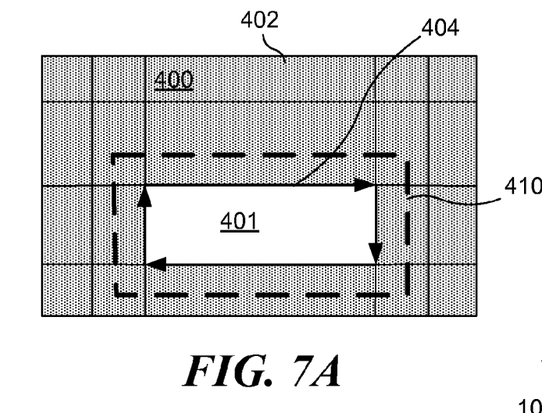
FIG. 7A is a schematic view showing an exemplary hole loop for a first case, where the hole is formed in a 2-D surface.
Figure 7B:
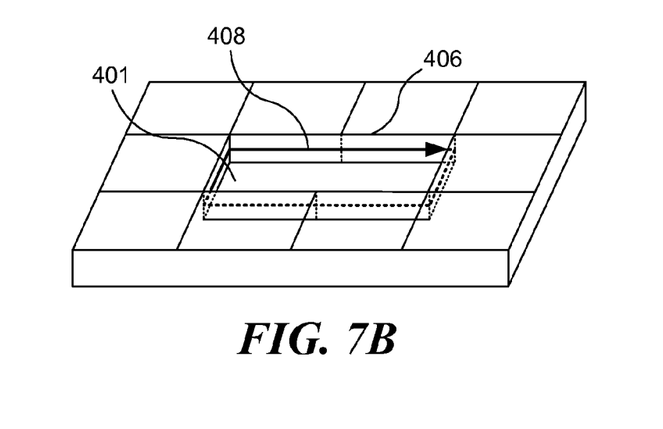
FIG. 7B is a schematic isometric view of an exemplary hole loop for a first case, where the hole is formed in a 3-D surface.
Figure 12B:
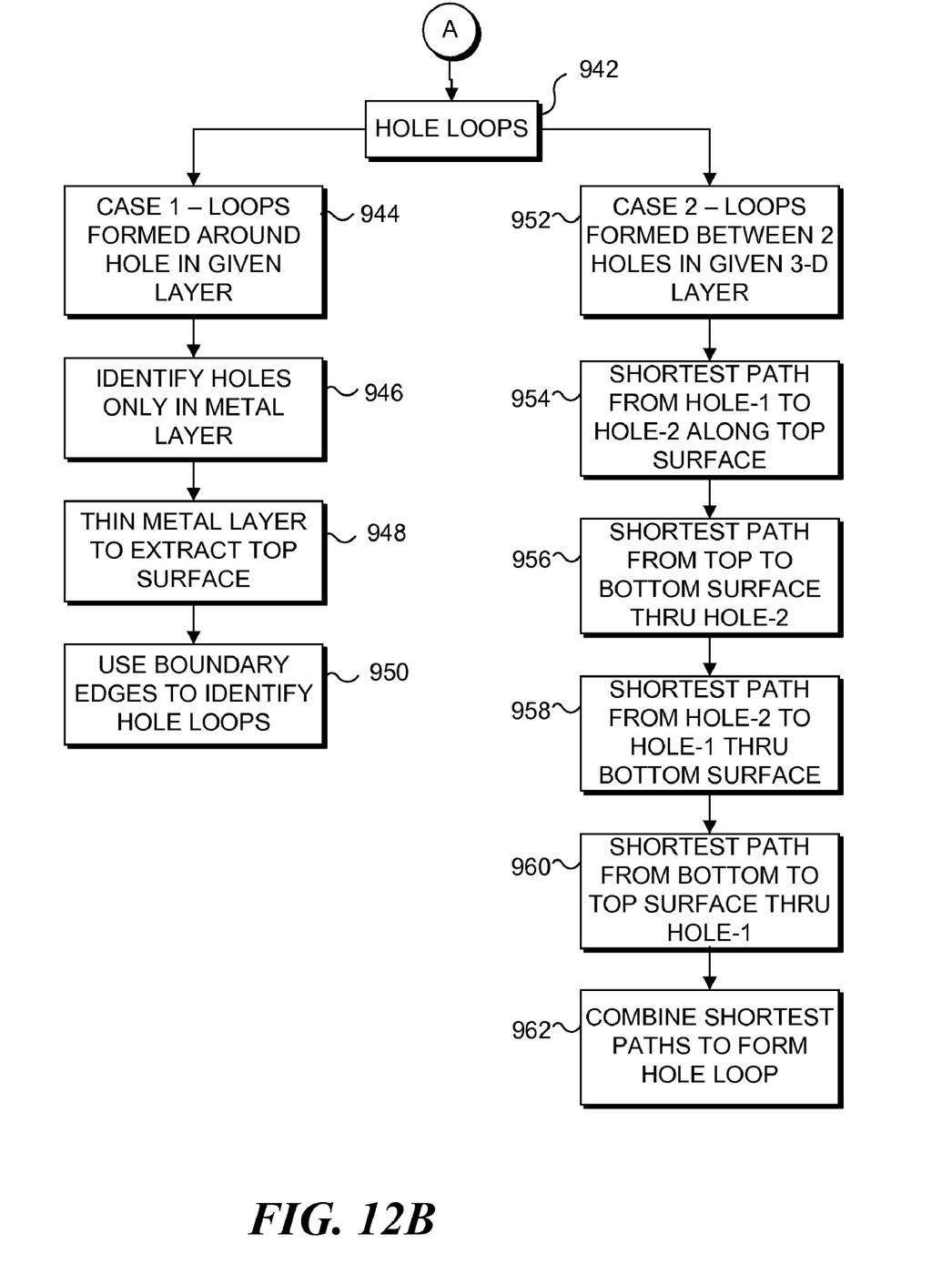

There are also two cases for detecting loops around holes in a circuit, and the logical steps employed for both are shown in FIG. 12B under a block 942, as follows. As indicated in a block 944, the first case is for loops formed around a hole in a given layer. In the simple example of FIG. 7A, a hole 401 is formed in a metal surface. A hole loop 410 around hole 401 is identified by employing the following exemplary steps. The approach in this case starts with a step 946, as shown in FIG. 12B. Step 946 identifies holes only in a "metal" layer. A step 948 indicates that the metal layer is thinned to extract a top thinned open surface 400 (thinning is necessary only if the layer is 3-D, i.e., has thickness). In a step 950, all of the boundary edges in the thinned metal mesh of this surface are found and are linked together to determine boundary contours 402, and 404, as shown in FIG. 7A. Outer boundary contour 402 is identified as the one fitting in the largest bounding rectangle and is discarded. All of the remaining boundary contours, i.e., contour 404 in this example, are identified as internal holes in the metal. All of the vertices on the hole contours are identified. These contours can be part of a 2-D metal layer, i.e., contour 404 in FIG. 7A (representing a top contour 406 of a 3-D metal layer in the actual geometry, before thinning, as shown in FIG. 7B). For a 3-D layer, all the edges formed by extrusion of those vertices in the vertical dimension are included in a hole loop 408. For a 2-D metal layer, all of the non-boundary edges connecting to those vertices are included in hole loop 410.

Figure 7C:
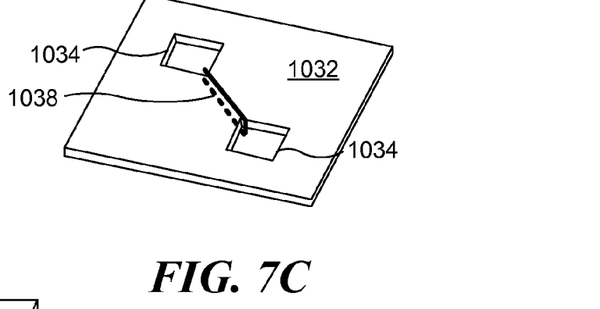
FIG. 7C is a schematic isometric view of an exemplary hole loop for a second case, where the hole loop is formed between two holes in a surface.

As indicated in a block 952, the second case covers loops formed between two holes in a given 3-D layer. This case is illustrated in the simple example provided in FIG. 7C, for 3-D metallic layer 1032, where a hole loop 1038 is formed between holes 1034 and extends around the top and bottom surfaces of the layer.

The method starts with a step 954, which determines the shortest path from a Hole-1 to a Hole-2 along the top surface of the 3-D layer. A step 956 then determines the shortest path from the top surface to the bottom surface through Hole-2. Similarly, a step 958 determines the shortest path from Hole-2 to Hole-1 along the bottom surface, and a step 960 determines the shortest path from the bottom surface to the top surface through Hole-1. These shortest paths are combined to form a hole loop of the second type, in a step 962.

Exemplary Computing Device for Practicing Novel Technique

Figure 13:
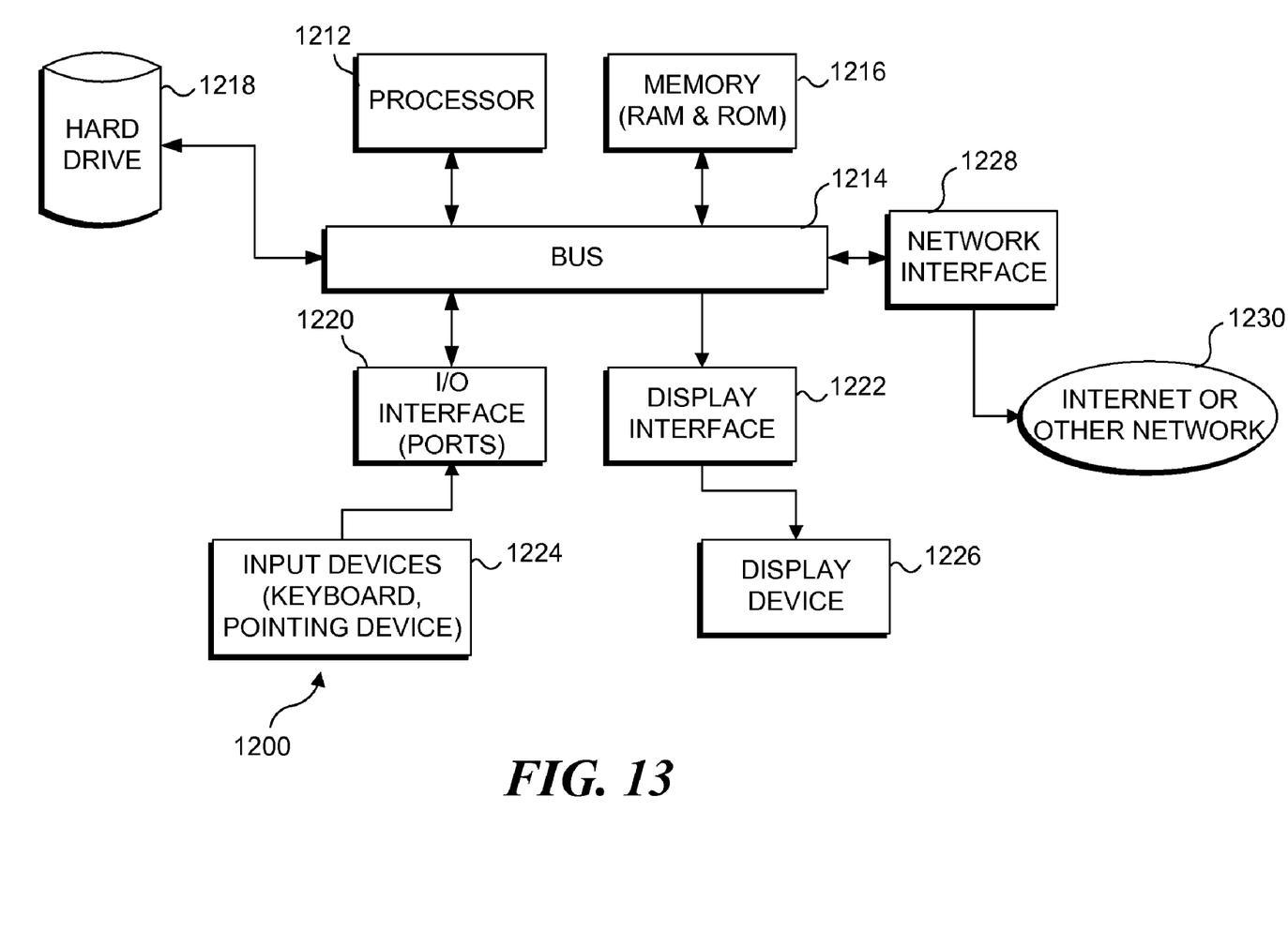
FIG. 13 is a functional block diagram of an exemplary computing device that is suitable for use in a system for implementing the present novel approach for determining EM basis functions for an electrical circuit.

FIG. 13 illustrates an exemplary computing system 1200 that is suitable for use as a computing device employed for implementing the novel approach described above. Computing system 1200 includes a processor 1212 that is coupled in communication with a generally conventional data bus 1214. Also coupled to the data bus are a memory 1216 that includes both random access memory (RAM) and read only memory (ROM). Machine instructions are loaded into memory 1216 from storage on a hard drive 1218 or from other suitable non-volatile memory, such as an optical disk or other optical or magnetic storage media. The storage can also include files that define geometry and topology data for the electrical circuit. The machine instructions in storage, when transferred to memory 1216 and executed by processor 1212, can cause the processor to carry out a plurality of different functions employed to implement the novel approach, as described herein, as well as other functions.

An input/output (I/O) interface 1220 that includes a plurality of different types of ports, such as serial, parallel, universal serial bus, PS/2, and Firewire ports, is coupled to data bus 1214 and is in turn connected to one or more input devices 1224, such as a keyboard, mouse, or other pointing device, enabling a user to interact with the computing system and to provide input and control the operation of the computing system. A display interface 1222 couples a display device 1226 to the data bus, enabling graphic and text information to be displayed for viewing by a user. The computing system is optionally coupled to a network 1230 and/or to the Internet via a network interface 1228, which couples to data bus 1214.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention in which an exclusive right is claimed is defined by the following:

1. A method for employing a computing device for determining electromagnetic coupling for a multiple layer electronic circuit in an automated manner, comprising the steps of:
   (a) using the computing device for reading geometry data defining a geometry of the electronic circuit, wherein the geometry data represent a physical layout of the electronic circuit;
   (b) using the computing device for reading topology data defining a topology of the electronic circuit, wherein the topology data include a schematic representation of the electronic circuit;
   (c) processing the geometry data with the computing device to determine an internal port geometry and an external port geometry for the electronic circuit;
   (d) creating electromagnetic coupling basis functions for the electronic circuit with the computing device, using the topology data and the internal port and external port geometry, wherein the electromagnetic coupling basis functions include a lump circuit basis function and define the electromagnetic coupling for the electronic circuit; and
   (e) presenting the electromagnetic coupling basis functions to a user.

2. The method of claim 1, wherein the step of reading the geometry data comprises the step of creating a three-dimensional mesh representing the physical layout of the electronic circuit, including any conductive layers, vias interconnecting connective layers, and holes formed in the conductive layers.

3. The method of claim 2, wherein the geometry data comprise a two-dimensional layout file, and wherein the step of creating the three-dimensional mesh comprises the steps of:
   (a) reading the two-dimensional layout file;
   (b) performing preprocessing, including merging discrete polygons included in the two-dimensional layout file and identifying any holes in a two-dimensional layout defined by the two-dimensional layout file;
   (c) creating a two-dimensional mesh of polygons for each layer that is included in the two-dimensional layout, after the step of preprocessing;
   (d) extruding each layer and via included in the two-dimensional mesh to form the three-dimensional mesh; and
   (e) linking the vias to attached layers with circuit connections, so that the vias comprise a portion of the three-dimensional mesh.

4. The method of claim 3, wherein the step of creating the electromagnetic coupling basis functions comprises the steps of using the three-dimensional mesh to automatically detect all loop-tree formations, wherein the loops comprise a set of divergence-free basis functions and include all local loops, via loops, and hole loops within the geometry data, and all loops detected are linearly independent, and wherein tree formations comprise a set of divergent basis functions that are loop-free.

5. The method of claim 4, wherein the step of using the three-dimensional mesh to detect local loops comprises the steps of:
   (a) selecting a vertex defining a node in three-dimensional mesh;
   (b) collecting all basis functions flowing through edges that are connected to the node; and
   (c) eliminating partial loops that pass through an outer edge of the three-dimensional mesh.

6. The method of claim 4, wherein the step of detecting loops comprises the step of detecting each of two types of via loops, including one type in which a via loop is formed between two vias joined to the same conductive layers in the geometry data, and another type in which a via loop is formed between two circuit connections running from a via to the same conductive layer.

7. The method of claim 6, wherein for each different pair of vias that are joined to the same conductive layers, the step of detecting the one type of via loop that is formed between the two vias joined to the same conductive layers comprises the steps of:
   (a) identifying each of the two vias of the pair;
   (b) finding a shortest path within the conductive layers between the two vias and between the conductive layers, in each conductive layer, excluding the vias;
   (c) finding a shortest path through each of the two vias; and
   (d) combining the shortest paths between the two vias and through each of the two vias, so as to form the one type of via loop.

8. The method of claim 6, wherein the step of detecting the other type of via loop that is formed between two circuit connections running from a via to the same conductive layer comprises the steps of:
   (a) identifying a via;
   (b) finding and enlisting all circuit connections running from the via to the same conductive layer;
   (c) identifying end points of each circuit connection in the conductive layer;
   (d) identifying end points of each circuit connection in the via; and
   (e) joining the end points for each different pair of circuit connections to form via loops, wherein each different via loop thereby includes the end points for a different pair of circuit connections.

9. The method of claim 4, wherein the step of detecting loops comprises the step of detecting each of two types of hole loops, including one type in which a hole loop is formed around a hole in a given conductive layer, and another type in which a hole loop is formed between two holes in a given three-dimensional conductive layer having a first surface, and a second surface that is generally on an opposite side of the conductive layer than the first surface.

10. The method of claim 9, wherein the step of detecting the one type of hole loop that is formed around a hole in a given conductive layer comprises the steps of:
    (a) ensuring that the hole is formed in a conductive layer and not in a via;
    (b) thinning the conductive layer to extract the first surface of the conductive layer; and (c) joining boundary edges of the conductive layer around the hole to form the hole loop in the first surface.

11. The method of claim 4, wherein the step of automatically detecting tree formations comprises the step of executing a spanning tree algorithm over a connected graph formed by elements of the three-dimensional mesh and the connectivity of the elements through edges of the three-dimensional mesh and circuit connections.

12. The method of claim 11, further comprising the step of rearranging the tree formation basis functions to map onto a charge for each polygon in the three-dimensional mesh.

13. The method of claim 12, wherein the step of rearranging the tree formation basis functions includes an iterative process and comprises the step of improving a convergence of the iterative process by preconditioning the tree formation basis functions.

14. The method of claim 1, wherein the step of processing the geometry data to determine each external port in the circuit comprises the step of identifying each connection between two distinct nets, wherein each discrete net comprises an independent metal geometry that may be electrically coupled with another discrete net by one or more components of the circuit.

15. The method of claim 1, wherein the step of processing the geometry data to determine each internal port in the circuit comprises the step of determining where a surface or a subsurface of the geometry data is associated with one or more circuit nodes.

16. A memory medium on which computer readable and executable machine instructions are stored for carrying out the steps of claim 1.

17. A system for determining electromagnetic coupling for a multiple layer electronic circuit in an automated manner, comprising:
   (a) a memory in which geometry data defining a geometry of the electronic circuit, topology data defining a topology of the electronic circuit and including a schematic representation of the electronic circuit, and machine instructions are stored;
   (b) a display for displaying data to a user; and
   (c) a processor coupled to the memory and the display, the processor executing the machine instructions to carry out a plurality of functions, including:
      (i) reading the geometry data from the memory;
      (ii) reading the topology data from the memory;
      (iii) processing the geometry data to determine an internal port geometry and an external port geometry for the electronic circuit;
      (iv) creating electromagnetic coupling basis functions for the electronic circuit using the topology data and the internal port and external port geometry, wherein the electromagnetic coupling basis functions include a lump circuit basis function and define the electromagnetic coupling for the electronic circuit; and
      (v) presenting the electromagnetic coupling basis functions to a user.

18. The system of claim 17, wherein the machine instructions further cause the processor to create a three-dimensional mesh representing the physical layout of the electronic circuit, including any conductive layers, vias interconnecting connective layers, and holes formed in the conductive layers.

19. The system of claim 18, wherein the geometry data comprise a two-dimensional layout file, and wherein the machine instructions further cause the processor to:
   (a) read the two-dimensional layout file;
   (b) perform preprocessing, including merging discrete polygons included in the two-dimensional layout file and identifying any holes in a two-dimensional layout defined by the two-dimensional layout file;
   (c) create a two-dimensional mesh of polygons for each layer that is included in the two-dimensional layout, after the step of preprocessing;
   (d) extrude each layer and via included in the two-dimensional mesh to form the three-dimensional mesh; and
   (e) link the vias to attached layers with circuit connections, so that the vias comprise a portion of the three-dimensional mesh.

20. The system of claim 19, wherein the machine instructions further cause the processor to automatically detect all loop-tree formations, wherein the loops comprise a set of divergence-free basis functions and include all local loops, via loops, and hole loops within the geometry data, and wherein all loops detected are linearly independent, and wherein tree formations comprise a set of divergent basis functions that are loop-free.

21. The system of claim 20, wherein the machine instructions further cause the processor to use the three-dimensional mesh to detect loops by:
   (a) selecting a vertex defining a node in three-dimensional mesh;
   (b) collecting all basis functions flowing through edges that are connected to the node; and
   (c) eliminating partial loops that pass through an outer edge of the three-dimensional mesh.

22. The system of claim 20, wherein the machine instructions further cause the processor to detect each of two types of via loops, including one type in which a via loop is formed between two vias joined to the same conductive layers in the geometry data, and another type in which a via loop is formed between two circuit connections running from a via to the same conductive layer.

23. The system of claim 22, wherein for each different pair of vias that are joined to the same conductive layers, the machine instructions further cause the processor to detect the one type of via loop that is formed between the two vias joined to the same conductive layers by:
   (a) identifying each of the two vias of the pair;
   (b) finding a shortest path between the two vias, in each conductive layer, excluding the vias;
   (c) finding a shortest path between the conductive layers through each of the two vias; and
   (d) combining the shortest paths within the conductive layers between the two vias, and through each of the two vias, so as to form the one type of via loop.

24. The system of claim 22, wherein the machine instructions further cause the processor to detect the other type of via loop that is formed between two circuit connections running from a via to the same conductive layer, by:
   (a) identifying a via;
   (b) finding and enlisting all circuit connections running from the via to the same conductive layer;
   (c) identifying end points of each circuit connection in the conductive layer;
   (d) identifying end points of each circuit connection in the via; and
   (e) joining the end points for each different pair of circuit connections to form via loops, wherein each different via loop thereby includes the end points for a different pair of circuit connections.

25. The system of claim 20, wherein the machine instructions further cause the processor to detect each of two types of hole loops, including one type in which a hole loop is formed around a hole in a given conductive layer, and another type in which a hole loop is formed between two holes in a given three-dimensional conductive layer having a first surface, and a second surface that is generally on an opposite side of the conductive layer than the first surface.

26. The system of claim 25, wherein the machine instructions further cause the processor to detect the one type of hole loop that is formed around a hole in a given conductive layer, by:

(a) ensuring that the hole is formed in a conductive layer and not in a via;

(b) thinning the conductive layer to extract the first surface of the conductive layer; and (c) joining boundary edges of the conductive layer around the hole to form the hole loop in the first surface.

27. The system of claim 20, wherein the machine instructions further cause the processor to automatically detect tree formations by executing a spanning tree algorithm over a connected graph formed by elements of the three-dimensional mesh and the connectivity of the elements through edges of the three-dimensional mesh and circuit connections.

28. The system of claim 27, wherein the machine instructions further cause the processor to rearrange the tree formation basis functions to map onto a charge for each polygon in the three-dimensional mesh.

29. The system of claim 28, wherein the machine instructions further cause the processor to rearrange the tree formation basis functions by using an iterative process and to improve a convergence of the iterative process by preconditioning the tree formation basis functions.

30. The system of claim 17, wherein the machine instructions further cause the processor to identify each connection between two distinct nets, wherein each discrete net comprises an independent metal geometry that may be electrically coupled with another discrete net by one or more components of the circuit.

31. The system of claim 17, wherein the machine instructions further cause the processor to determine each internal port in the circuit, by determining where a surface or a sub-surface of the geometry data is associated with one or more circuit nodes.

* * * * *